(12) United States Patent
Raschke

(10) Patent No.: US 12,730,371 B2
(45) Date of Patent: Sep. 8, 2026

(54) EXTREME ULTRAVIOLET INNER POD SEAL GAP

(71) Applicant: ENTEGRIS, INC., Billerica, MA (US)

(72) Inventor: Russ V. Raschke, Chanhassen, MN (US)

(73) Assignee: ENTEGRIS, INC., Billerica, MA (US)

( * ) Notice: Subject to any disclaimer, the term of this patent is extended or adjusted under 35 U.S.C. 154(b) by 874 days.

(21) Appl. No.: 17/973,170

(22) Filed: Oct. 25, 2022

(65) Prior Publication Data

US 2023/0129336 A1 Apr. 27, 2023

Related U.S. Application Data

(60) Provisional application No. 63/271,617, filed on Oct. 25, 2021.

(51) Int. Cl.
*G03F 1/66* (2012.01)

(52) U.S. Cl.
CPC .................................... *G03F 1/66* (2013.01)

(58) Field of Classification Search
CPC . G03F 1/66; G03F 7/70741; H01L 21/67353; H01L 21/67359; H01L 21/67376; H01L 21/67386; H01L 21/67393
See application file for complete search history.

(56) References Cited

U.S. PATENT DOCUMENTS 5,611,452 A * 3/1997 Bonora ..................... G03F 1/66 414/217
7,304,720 B2 * 12/2007 del Puerto ............. B82Y 40/00 355/75
11,508,592 B2 * 11/2022 Lin ................... H01L 21/67294
2006/0109449 A1 5/2006 Matsutori et al.
2007/0002516 A1 1/2007 Matsumoto
2008/0173560 A1 7/2008 Umeda et al.
2014/0116920 A1 5/2014 Lee et al.
2019/0214287 A1 7/2019 Chiu
2021/0047094 A1 2/2021 Chuang et al.
2022/0404696 A1 * 12/2022 Wang ................ H01L 21/67376

FOREIGN PATENT DOCUMENTS

KR 100567894 B1 4/2006
KR 101165855 B1 7/2012
TW 201228902 A 7/2012
TW 201827920 A 8/2018

OTHER PUBLICATIONS

EUV Inner Pods Having Reduced or Eliminated Particle Contamination, Research Disclosure, Kenneth Mason Publications, vol. 630, No. 8, p. 725, 2016.

* cited by examiner

*Primary Examiner* — Hung V Nguyen

(57) ABSTRACT

An apparatus includes a reticle pod. The reticle pod includes a baseplate having a first surface, a cover having a second surface, and a stand-off mechanism on at least one of the cover and the baseplate. The first surface includes a first sealing surface on a periphery of the baseplate. The second surface includes a second sealing surface on a periphery of the cover. The stand-off mechanism is configured to create a linear gap between the first sealing surface and the second sealing surface when the cover is attached to the baseplate.

20 Claims, 8 Drawing Sheets

EXTREME ULTRAVIOLET INNER POD SEAL GAP

PRIORITY

This disclosure claims priority to U.S. provisional patent No. 63/271,617 with a filing date of Oct. 25, 2021. The priority document is hereby incorporated by reference for all purposes.

FIELD

This disclosure relates generally to reticle pods used for reticles. More specifically, the disclosure relates to apparatus and method for creating a linear gap between sealing surfaces of a cover and a baseplate of a reticle pod such as an extreme ultraviolet (EUV) reticle pod, when the cover is attached to the baseplate.

BACKGROUND

Reticle pods are used for containing reticles such as, for example, photolithography masks used during semiconductor processing, such as during EUV treatment. Reticle pods can be used for storage and transport of reticles. A reticle pod can include an inner pod that is handled and manipulated by one or more tools during processing. The inner pod of the reticle pod includes a baseplate and a cover, and the baseplate and the cover contain the reticle and protect the reticle from contamination or physical damage during transport, storage, and processing. Reticle pods include, for example, EUV pods for use with EUV photolithography tools. Reticle pods can include an outer pod with a pod door and a pod dome, which contains the inner pod.

SUMMARY

This disclosure relates generally to reticle pods used for reticles. More specifically, the disclosure relates to apparatus and method for creating a linear gap between sealing surfaces of a cover and a baseplate of a reticle pod such as an extreme ultraviolet (EUV) reticle pod, when the cover is attached to the baseplate.

A reticle pod can include an inner pod (e.g., a metal inner pod, etc.). The inner pod of the reticle pod includes a cover and a baseplate. Over time, wear occurs at sealing surfaces of the cover and the baseplate during use. A linear gap can be created to maintain a minimal distance between the sealing surfaces of the cover and the baseplate while removing the contact or moving the contact (between the sealing surfaces) and the associated wear to a location away from sealing surfaces.

In an embodiment, an apparatus includes a reticle pod. The reticle pod includes a baseplate having a first surface, a cover having a second surface, and a stand-off mechanism on at least one of the cover and the baseplate. The first surface includes a first sealing surface on a periphery of the baseplate. The second surface includes a second sealing surface on a periphery of the cover. The stand-off mechanism is configured to create sealing via a linear gap between the first sealing surface and the second sealing surface when the cover is attached to the baseplate.

In an embodiment, the linear gap extends from the periphery of the cover and the periphery of baseplate to an interior space within the reticle pod.

In an embodiment, the reticle pod is a EUV reticle pod. The baseplate and the cover are configured to accommodate a reticle when the cover is attached to the baseplate.

In an embodiment, the apparatus further includes an outer pod dome and an outer pod door. The outer pod dome and the outer pod door are configured to accommodate the baseplate and the cover within the outer pod dome when the outer pod door is attached to the outer pod dome.

In an embodiment, a minimum size of the linear gap is at or about 2 microns.

In an embodiment, a maximum size of the linear gap is at or about 40 microns.

In an embodiment, the stand-off mechanism includes a plurality of stand-off pads. One of the first sealing surface and the second sealing surface includes a plurality of retention openings. The other of the first sealing surface and the second sealing surface includes a plurality of recesses. Each pad of the plurality of pads extends into one retention opening of the plurality of retention openings and is partially received in one recess of the plurality of recesses, respectively.

In an embodiment, the plurality of pads includes at least three pads.

In an embodiment, the plurality of pads includes eight pads.

In an embodiment, the plurality of pads is made of polymer.

In an embodiment, the plurality of pads is made of metal.

In an embodiment, the plurality of retention openings is a plurality of through holes.

In an embodiment, the plurality of pads is pressed in the plurality of retention openings, respectively, and extends a fixed height from the one of the first sealing surface and the second sealing surface to create the linear gap.

In an embodiment, the plurality of pads is molded or machined in the plurality of retention openings, respectively, and extends a fixed height from the one of the first sealing surface and the second sealing surface to create the linear gap.

In an embodiment, a top surface of each pad of the plurality of pads is flush with or is slightly below flush with a top surface of the cover or a bottom surface of the baseplate.

In an embodiment, the reticle pod further includes a filter, and the sealing is configured such that the reticle pod has a conductance of at least 90%. In an embodiment, the conductance is at least 94%.

In an embodiment, a method of assembling a reticle pod is provided. The reticle pod including a baseplate having a first surface, a cover having a second surface, and a stand-off mechanism on at least one of the cover and the baseplate. The first surface includes a first sealing surface on a periphery of the baseplate. The second surface includes a second sealing surface on a periphery of the cover. The stand-off mechanism is configured to create sealing via a linear gap between the first sealing surface and the second sealing surface when the cover is attached to the baseplate. The method includes providing the stand-off mechanism on the at least one of the cover and the baseplate.

In an embodiment, the method further includes inserting a plurality of stand-off pads of the stand-off mechanism into a plurality of retention openings, respectively, and adjusting a height of each pad of the plurality of pads to a fixed height. The plurality of retention openings is on one of the first sealing surface and the second sealing surface. In an embodiment, a plurality of recesses is on the other of the first sealing surface and the second sealing surface. In an embodiment, adjusting the height of each pad of the plurality of pads to the fixed height includes machining the plurality of pads such that the height of each pad of the plurality of pads is the fixed height.

In an embodiment, adjusting the height of each pad of the plurality of pads to the fixed height includes pressing the plurality of pads such that the height of each pad of the plurality of pads is the fixed height.

In an embodiment, a minimum distance between each pad of the plurality of pads and an inner boundary of the first sealing surface or the second sealing surface is at or about 4 mm.

BRIEF DESCRIPTION OF THE DRAWINGS

References are made to the accompanying drawings that form a part of this disclosure and which illustrate the embodiments in which systems and methods described in this specification can be practiced.

The accompanying drawings illustrate various embodiments of systems, methods, and embodiments of various other aspects of the disclosure. Any person with ordinary skills in the art will appreciate that the illustrated element boundaries (e.g., boxes, groups of boxes, or other shapes) in the figures represent one example of the boundaries. It may be that in some examples one element may be designed as multiple elements or that multiple elements may be designed as one element. In some examples, an element shown as an internal component of one element may be implemented as an external component in another, and vice versa. Furthermore, elements may not be drawn to scale. Non-limiting and non-exhaustive descriptions are described with reference to the following drawings. The components in the figures are not necessarily to scale, emphasis instead being placed upon illustrating principles.

Like reference numbers represent like parts throughout.

DETAILED DESCRIPTION

Figure 1A:
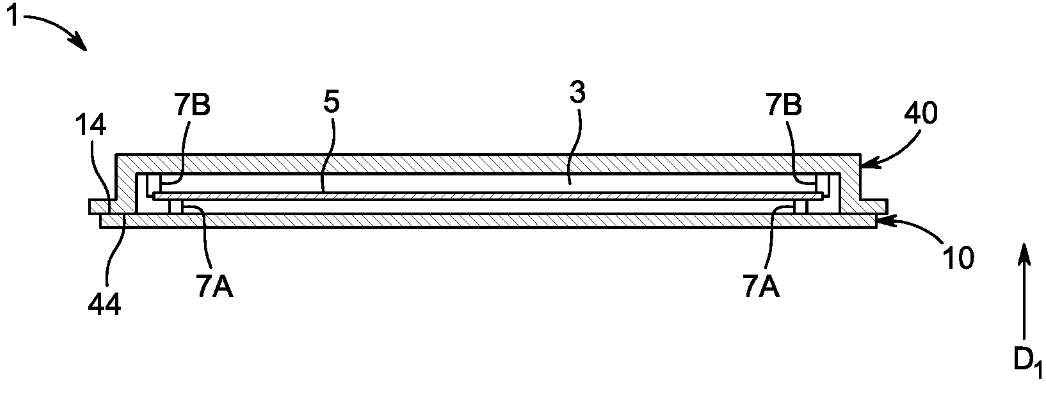
FIG. 1A is a cross-sectional view of an inner pod of a reticle pod when closed, according to an embodiment.

This disclosure relates generally to reticle pods used for reticles. More specifically, the disclosure relates to apparatus and method for creating a linear gap between sealing surfaces of a cover and a baseplate of a reticle pod such as an extreme ultraviolet (EUV) reticle pod, when the cover is attached to the baseplate.

Photolithography tools can utilize EUV light to enable finer line widths. Due to the use of EUV light, lithography can take place in a vacuum to reduce loss of energy of the EUV light. Given the vacuum requirement, the pods used to transfer and store reticles used in EUV can be designed as dual pods consisting of an outer pod (typically made of polymer materials or the like) to protect the reticles when outside a lithography tool, and an inner pod (made mostly of metals and low outgassing materials or the like) to transfer the reticles into the vacuum area of the EUV lithography tool. EUV inner pods utilize two mating flat surfaces (typically constructed of metal or the like) to create a particle barrier and protect a reticle. These mating surfaces wear in use through outer pod cycles and opening and closing of the inner pods. This wear can be considered as a particle concern and flaw reducing the quality of the pod. Embodiment disclosed herein can reduce the wear at this interface and reduce particles created, or at the transferring of the reticle, by e.g., creating a linear gap between the sealing/mating surfaces.

The following definitions are applicable throughout this disclosure. As defined herein, the term “linear” can refer to e.g., arranged in or extending along a straight or nearly straight line. The term “linear gap” can refer to e.g., a gap formed between a first edge and a second edge, each of the first edge and the second edge being arranged in or extending along a straight or nearly straight line, and a size of the gap being a distance between the first edge and the second edge. For example, a linear gap can be created between sealing surfaces of a cover and a baseplate, and a size of the gap is a distance between the sealing surfaces of the cover and the baseplate.

Some embodiments of the present application are described in detail with reference to the accompanying drawings so that the advantages and features of the present application can be more readily understood by those skilled in the art. The terms “near”, “far”, “top”, “bottom”, “left”, “right” and the like described in the present application are defined according to the typical observation angle of a person skilled in the art and for the convenience of the description. These terms are not limited to specific directions.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Particular embodiments of the present disclosure are described herein with reference to the accompanying drawings; however, it is to be understood that the disclosed embodiments are merely examples of the disclosure, which can be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure. In this description, as well as in the drawings, like-referenced numbers represent elements that can perform the same, similar, or equivalent functions.

Additionally, the present disclosure can be described herein in terms of functional block components and various processing steps. It should be appreciated that such functional blocks can be realized by any number of hardware and/or software components configured to perform the specified functions. For example, the present disclosure can employ various processing elements, logic elements, and the like, which can carry out a variety of functions under the control of one or more microprocessors or other control devices.

The scope of the disclosure should be determined by the appended claims and their legal equivalents, rather than by the examples given herein. For example, unless otherwise stated, the steps recited in any method claims can be executed in any order and are not limited to the order presented in the claims. Moreover, no element is essential to the practice of the disclosure unless specifically described herein as "critical" or "essential".

Figure 1B:
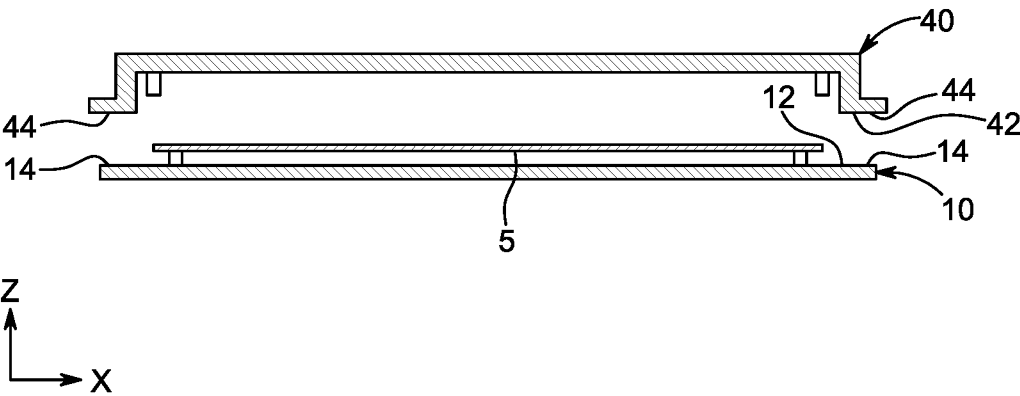
FIG. 1B is a cross-sectional view of the inner pod in FIG. 1A when open, according to an embodiment.

FIGS. 1A and 1B show cross-sectional views an inner pod 1 of a reticle pod, according to an embodiment. FIG. 1A shows the inner pod 1 when closed. FIG. 1B shows the inner pod 1 when open. The inner pod 1 has an internal space with a reticle containment portion 3 for containing a reticle 5. The pod 1 can include reticle supports 7A, 7B within the reticle containment portion 3 for supporting the reticle 5 within the inner pod 1.

The inner pod 1 includes a baseplate 10 and a cover 40. In an embodiment, the baseplate 10 and the cover 40 are configured to be joined together to provide sealing between the baseplate 10 and the cover 40. As shown in FIG. 1A, the internal space of the inner pod 1 is enclosed (e.g., closed) by placing the cover 40 on the baseplate 10. In an embodiment, the cover 40 directly contacts the baseplate 10. In particular, the bottom 42 of the cover 40 contacts the top 12 of the baseplate 10. In another embodiment, a gap (e.g., a linear gap, see FIG. 7) can be created between sealing surfaces of the cover 40 and the baseplate 10. The inner pod 1 is opened by moving the cover 40 away from the baseplate 10 (e.g., by moving the cover upwards in direction Di, etc.). For example, an external tool (e.g., automated arm, etc.) opens the inner pod 1 to access the reticle containment portion 3 and remove the reticle 5.

The baseplate 10 and the cover 40 include one or more sealing surface(s) that are configured to provide sealing between the baseplate 10 and the cover 40. For example, the sealing can be configured to reduce or prevent external containments (e.g., air, dust, etc.) from entering the pod 1 by passing between the baseplate 10 and the cover 40. In an embodiment, the baseplate 10 includes one or more sealing surfaces that directly contact the cover 40 when the cover 40 is placed on the baseplate 10. In another embodiment, a gap (e.g., a linear gap, see FIG. 7) can be created between the one or more sealing surfaces of the baseplate 10 and the cover 40 when the cover 40 is placed on the baseplate 10. In an embodiment, the cover 40 includes one or more sealing surface configured to directly contact the baseplate 10 when the cover 40 is placed on the baseplate 10. In another embodiment, a gap (e.g., a linear gap, see FIG. 7) can be created between the one or more sealing surfaces of the cover 40 and the baseplate 10 when the cover 40 is placed on the baseplate 10. For example, the baseplate 10 can include a first sealing surface (e.g., sealing surface 14), and the cover 40 can include a second sealing surface (e.g., sealing surface 44).

Sealing at the sealing surfaces 40 can be achieved by providing a linear gap having a predetermined size, with the predetermined size being selected such that sealing is still provided even when the sealing surfaces do not contact one another. The sealing can provide a pressure differential between the interior of the inner pod 1 and the ambient environment for a predetermined time following a change in conditions in the ambient environment, such as pumping down to a vacuum in the ambient environment or releasing of a previously-achieved vacuum, as can occur in a load lock where inner pod 1 can be placed. The pressure differential indicates that the seal significantly resists flow of air into and out of the interior space of the inner pod 1, even with the presence of the gap between the sealing surfaces.

In an embodiment where the inner pod 1 includes a filter, the sealing effectiveness of sealing surfaces can be measured by determining a conductance. The conductance can be a ratio of the quantity of flow passing through the filter compared to a total flow into the inner pod 1 through the filter and the sealing surfaces. The conductance can be determined according to the following formula:

$$\text{Conductance} = \frac{V}{(P_{EIP} - P_{chamber})} * \frac{dP_{EIP}}{dt}$$

Where:

V=volume of inner pod interior $P_{EIP}$=pressure inside inner pod $P_{chamber}$=pressure inside test chamber t=time In an embodiment, the size of the linear gap between the sealing surfaces can be selected such that the conductance is 90% or greater. In an embodiment, the size of the linear gap between the sealing surfaces can be selected such that the conductance is 92% or greater. In an embodiment, the size of the linear gap between the sealing surfaces can be selected such that the conductance is 94% or greater. In an embodiment, the size of the linear gap between the sealing surfaces can be selected such that the conductance is 95% or greater. In an embodiment, a size of the linear gap between the sealing surfaces of pod 1 providing suitable sealing is approximately 13 microns, or approximately 0.0005 inches. It is understood that the size of the linear gap is an average value and that surface variances, manufacturing tolerances, and the like can cause some variation in the size of the linear gap across the sealing surfaces. The sealing surfaces can be spaced apart sufficiently to reduce or eliminate contact at the sealing surfaces, thus reducing rubbing or other mechanical contact that can cause wear and generation of particles at the sealing surfaces while providing these conductance values.

Figure 2:
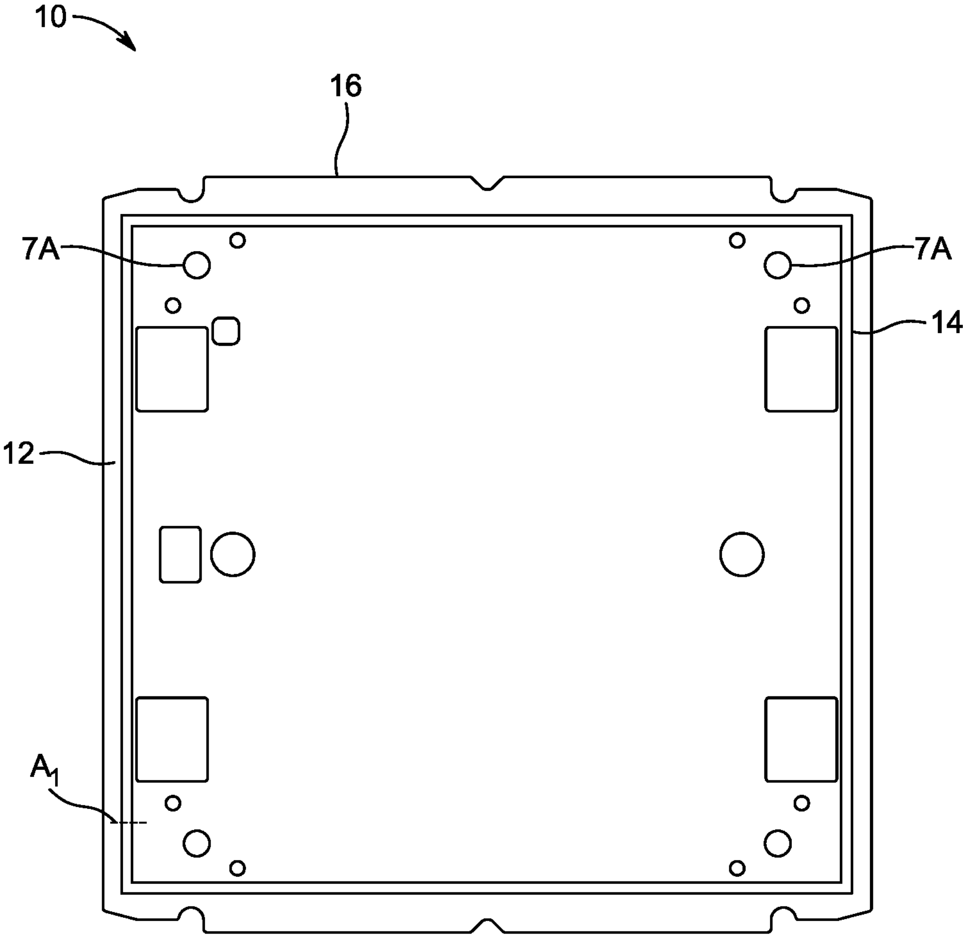
FIG. 2 is a top view of a baseplate in a reticle pod, according to an embodiment.

FIG. 2 is a top view of the baseplate 10 for a reticle pod, according to an embodiment. FIG. 2 shows the top 12 of the baseplate 10. The cover 40 is configured to be placed onto the top 12 of the baseplate 10. The baseplate 10 can also include the reticle supports 7A.

The baseplate 10 includes the sealing surface 14 and a baseplate body 16. The sealing surface 14 is formed on the baseplate body 16. The baseplate 10 in FIG. 2 includes a single continuous sealing surface 14. The sealing surface 14 extends along the entire perimeter of the baseplate 10. However, the baseplate 10 can include multiple sealing surfaces in an embodiment. For example, separate sealing surfaces 14 can be provided at locations in which greater amounts of wear occurs between the baseplate 10 and the cover 40. In an embodiment, the sealing surface(s) 14 of the baseplate 10 can only extend along a portion of the perimeter of the baseplate 10.

As shown in FIG. 2, the one or more sealing surfaces 14 are disposed so as to cover less than 75% of the baseplate 10. In an embodiment, the one or more sealing surfaces 14 are disposed so as to cover less than 50% of the baseplate 10. The embodiments described and recited herein are not limited to the quantity described. That is, the quantity described and recited herein are provided for descriptive purposes only and are not intended to be limiting.

Figure 3:
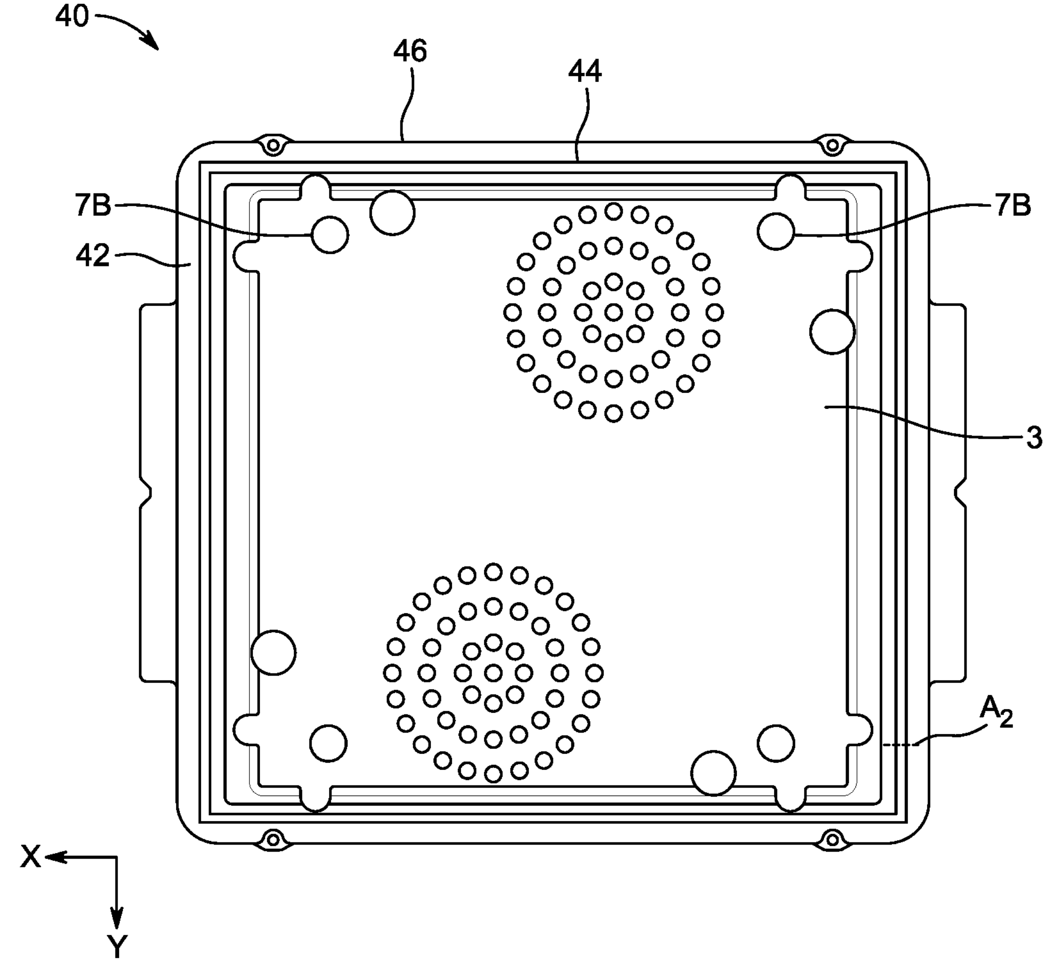
FIG. 3 is a bottom view of a cover for a reticle pod, according to an embodiment.

FIG. 3 is a bottom view of the cover 40 for an inner pod, according to an embodiment. FIG. 3 shows the bottom 42 of the cover 40. The bottom 42 of the cover 40 is configured to be placed onto the top 12 of the baseplate 40. The cover 40 can also include the reticle containment portion 3 and the reticle supports 7B that support the reticle within the inner pod.

The cover 40 includes the sealing surface 44 and a cover body 46. The sealing surface 44 is formed on the cover body 46. The cover 40 in FIG. 3 includes a single continuous sealing surface 44. However, the cover 40 can include multiple sealing surfaces in an embodiment. For example, each of the sealing surfaces 44 only extending along a portion of the perimeter of the base plate 40. For example, the separate sealing surfaces 44 can be provided at locations in which a greater amount of wear occurs between the baseplate 10 and the cover 40.

The sealing surface 44 extends along the entire perimeter of the cover 40. Accordingly, when the cover 40 is placed on the baseplate 10, the sealing surface 44 is disposed so as to extend along the entire perimeter of the baseplate 10. In some embodiments, the one or more sealing surfaces 14 of the baseplate 10 and the one or more sealing surfaces 44 of the cover 40 can be disposed so as to extend around the entire perimeter of the baseplate 10 in combination. For example, the sealing surface(s) 14 of the baseplate 10 cannot extend along the entire perimeter of the baseplate 10, and the sealing surface(s) 44 of the cover 40 extend along the portion(s) of the perimeter of the baseplate 10 without the sealing surface(s) 14. When considered in combination, the sealing surface(s) 14 of the baseplate 10 and the sealing surfaces 44 of the cover 40 would extend along the entire perimeter of the baseplate 10.

The sealing surface(s) 44 are provided so as to cover less than 75% of the cover 40. In an embodiment, the sealing surface(s) 44 cover less than 50% of the cover 40. The sealing surface(s) 14, 44 of the inner pod 1 are formed so as to cover less than 75% of the baseplate 10 and the cover 40. In an embodiment, the sealing surface(s) 14, 44 are formed so as to cover less than 50% of the baseplate 10 and the cover 40. The embodiments described and recited herein are not limited to the quantity described. That is, the quantity described and recited herein are provided for descriptive purposes only and are not intended to be limiting.

Figure 4:
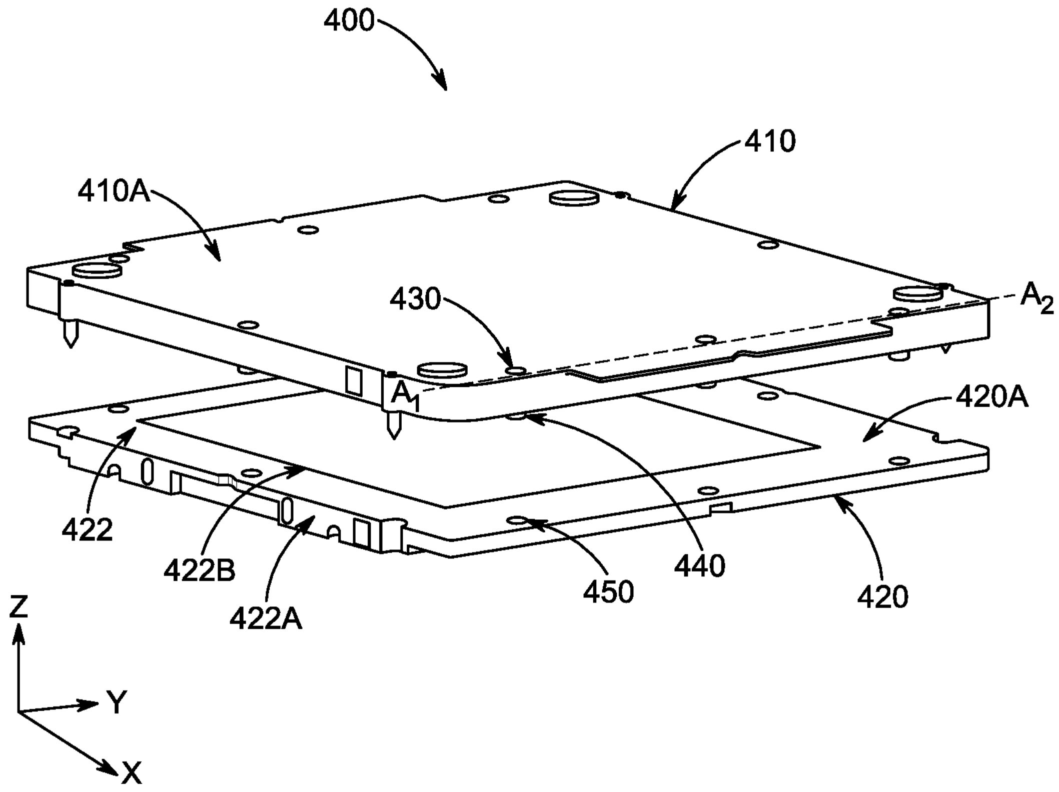
FIG. 4 is an exploded view of an inner pod of a reticle pod including a cover and a baseplate, according to an embodiment.

FIG. 4 is an exploded view of an inner pod 400 of a reticle pod including a cover 410 and a baseplate 420, according to an embodiment. It will be appreciated that the inner pod 400 can be the inner pod 1 of FIGS. 1A and 1B. The cover 410 can be the cover 40 of FIGS. 1A, 1B, and 3. The baseplate 420 can be the baseplate 10 of FIGS. 1A, 1B, and 2.

The cover 410 includes a top surface 410A, and a bottom surface facing the baseplate 420. The cover 410 also includes a sealing surface (412, see FIG. 5). The sealing surface 412 can be the sealing surface 44 of FIGS. 1A, 1B, and 3. The baseplate 420 includes a top surface 420A facing the cover 410, and a bottom surface. The baseplate 420 also include a sealing surface 422. The sealing surface 422 can be the sealing surface 14 of FIGS. 1A, 1B, and 2.

In an embodiment, the inner pod 400 includes a stand-off mechanism (430, 440, 450). It will be appreciated that the stand-off mechanism can be on the cover 410 or on the baseplate 420, or a portion of the stand-off mechanism can be on the cover 410, and another portion of the stand-off mechanism can be on the baseplate. The stand-off mechanism (430, 440, 450) is configured to minimize the wear at the sealing surfaces (412, 422) or between sealing surface 412 of the cover 410 and the sealing surface 422 of the baseplate 420. The stand-off mechanism (430, 440, 450) is configured to create a gap (e.g., a linear gap, see FIG. 7) and to maintain a minimal space between the sealing surfaces (412, 422) when the cover 410 is attached to (or placed on) the baseplate 420. In an embodiment, the stand-off mechanism (430, 440, 450) is configured to reduce or eliminate the physical contact and the associated wear from the sealing area surfaces (412, 422). In another embodiment, the stand-off mechanism (430, 440, 450) is configured to remove the physical contact or move the physical contact and the associated wear to a location away from the sealing area surfaces (412, 422). In an embodiment, the stand-off mechanism 430, 440, 450 includes projections from one of cover 410 or baseplate 420. In an embodiment, the projections can be a soft, ductile material such as gold. In an embodiment, the projections can be formed by deposition of materials. In an embodiment, the projections can be formed integrally in the machining of the cover 410 or baseplate 420. In an embodiment, the projections can be coated with a material. The coating material can be selected to reduce particle generation from contact between the projection and cover 410 or baseplate 420 opposite the projection.

In an embodiment, the stand-off mechanism (430, 440, 450) includes a plurality of retention openings 430, a plurality of stand-off pads 440, and a plurality of recesses 450. In an embodiment, as shown in FIG. 4, the openings 430 and the pads 440 can be on the cover 410 in an area defined by the sealing surface 412, and the recesses 450 can be on the baseplate 420 in an area defined by the sealing surface 422. In another embodiment, the openings 430 and the pads 440 can be on the baseplate 420 in an area defined by the sealing surface 422, and the recesses 450 can be on the cover 410 in an area defined by the sealing surface 412. It will be appreciated that the stand-off mechanism can have any suitable structure, as long as it can create a gap (e.g., a linear gap, see FIG. 7) and maintain a minimal space between the sealing surfaces (412, 422) when the cover 410 is attached to the baseplate 420.

It will be appreciated that each pad 440 of the pads corresponds to one opening 430 and one recess 450. That is, the number of the openings 430, the number of the pads 440, and the number of the recesses 450 can be the same. Each pad 440, the corresponding opening 430, and the corresponding recess 450 align with each other along the Z direction (the direction of the height of the inner pod 400). The number and spacing of the pads can be provided based on the characteristics of the cover 410 and/or baseplate 420, such as the flatness, surface variation, and the like, such that the pads 440 together are sufficient to provide proper spacing of the cover 410 and baseplate 420 and the maintenance thereof. In an embodiment, a minimum number of the pads 440 can be three. In an embodiment, a number of the pads 440 can be four. In an embodiment, a pad 440 can be disposed at each of the corners of the cover 410 or the baseplate 420. In an embodiment, a number of the pads 440 can be eight (see FIG. 4) or any suitable number. It will be appreciated that the number of pads 440 can depend on a flatness of the sealing surfaces of the cover 410 and/or the baseplate 420, and the pressure and loading applied to the sealing surfaces. In an embodiment, the pads 440 can be made of polymer (e.g., wear-resistant polymer or the like) such as loaded (Polyether Ether Ketone) PEEK materials, including, as non-limiting examples, polytetrafluoroethylene (PTFE) loaded PEEK, fiber loaded PEEK, or the like. The material of the pads 440 can be selected to reduce wear resulting from contact between the pad 440 and the cover 410 or baseplate 420. In an embodiment, the material of the pads 440 is selected to have hardness dissimilar to that of the cover 410 or baseplate 420. In an embodiment, the pads 440 can be made of metal such as a wear-resistant metal, a soft metal, or the like, with non-limiting examples including tungsten carbide, steel, gold or the like.

In an embodiment, the stand-off mechanism (430, 440, 450) is disposed in an area defined by the sealing surface 412 and/or 422. That is, the stand-off mechanism (430, 440, 450) is disposed within a boundary of the sealing surface 412 and/or 422. The sealing surface 422 extends along a periphery of the baseplate 420 from an outer edge 422A of the baseplate to an outer edge 422B of an interior space (see the internal space with a reticle containment portion 3 in FIG. 1A) within the inner pod 400. Similarly, the sealing surface 412 (see FIG. 5) extends along a periphery of the cover 410 from an outer edge 412A of the cover to an outer edge 412B of an interior space (see the internal space with a reticle containment portion 3 in FIG. 1A) within the inner pod 400.

In an embodiment, each pad 440 can extend into the corresponding retention opening 430, be partially received in the corresponding recess 450, and extend or protrude a fixed height between the sealing 412 and the sealing 422 to create a gap (e.g., a linear gap, see FIG. 7) when the cover 410 is attached to the baseplate 420. In an embodiment, the recess 450 is sized larger than the pad 440. In an embodiment, the recess 450 has a cross-sectional shape at least generally similar to that of the pad 440, such as each having a circular cross-section. In an embodiment, the recess 450 has a cross-sectional shape differing from that of the pad 440. In an embodiment, the depth of the recesses 450 is in a range from 0.5 millimeters (mm) to 3 mm.

In an embodiment, each retention opening 430 can be a through hole. In an embodiment, a top surface of each pad 440 can be flush with a top surface 410A of the cover 410. In another embodiment, a top surface of each pad 440 can be slightly below flush with the top surface 410A of the cover 410. In the embodiment that the pad 440 and the retention opening 430 are on the baseplate 420 and the recess 450 is on the cover 410, a bottom surface of each pad 440 can be flush with a bottom surface 420B of the baseplate 420, or be slightly above flush with the bottom surface 420B of the baseplate 420.

In an embodiment, each pad 440 can be pressed in the corresponding retention opening 430 to create a press fit (or interference fit, friction fit, or the like). In other embodiments, each pad 440 can be molded (e.g., injection molded or the like) or machined in the corresponding retention opening 430. In an embodiment, each pad 440 can be pressed in the corresponding recess 450 to create a press fit (or interference fit, friction fit, or the like). In an embodiment, each retention opening 430 can pass entirely through the cover 410 or baseplate 420. In an embodiment, each retention opening 430 has a depth of between 0.5 mm to 3 mm.

Figure 5:
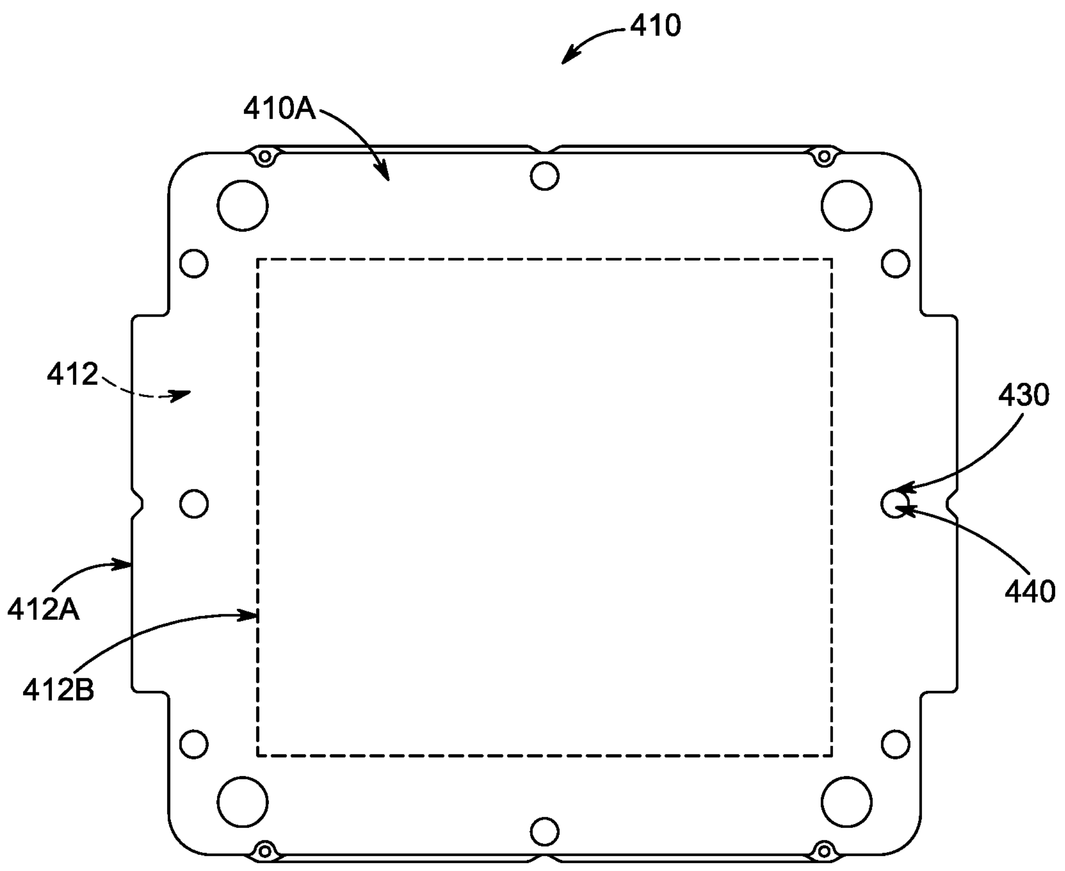
FIG. 5 is a top view of the cover of FIG. 4, according to an embodiment.

FIG. 5 is a top view of the cover 410 of FIG. 4, according to an embodiment. The cover 410 includes a top surface 410A. It will be appreciated that the sealing surface 412 (see the area pointed by the dotted arrow) is on the bottom surface (410B, see FIG. 6) side. Similarly, the outer edge 412B (see dotted lines) of an interior space (see the internal space with a reticle containment portion 3 in FIG. 1A) is also on the bottom surface (410B, see FIG. 6) side.

Figure 6:
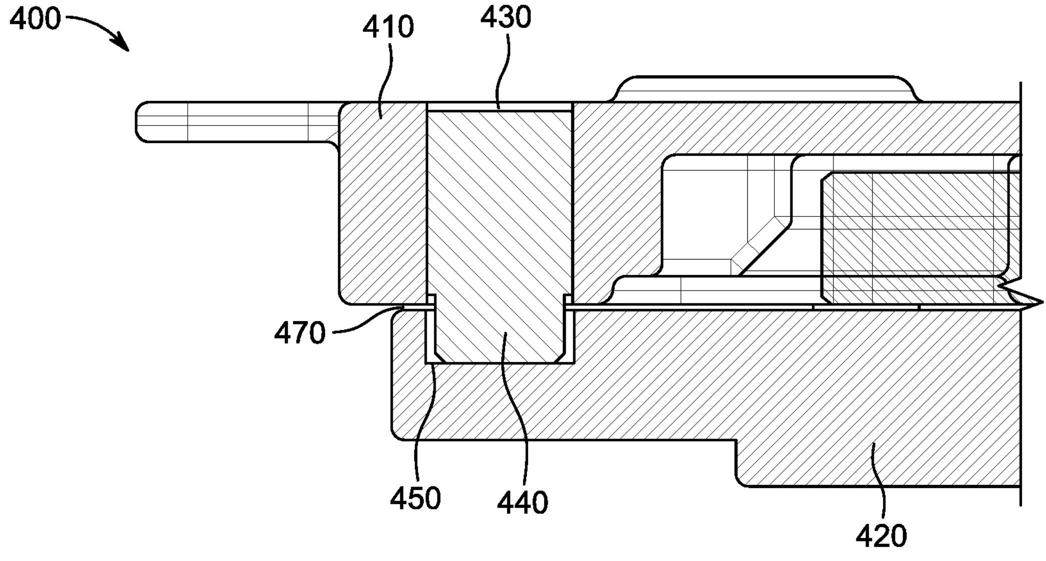
FIG. 6 is a cross-sectional view of an inner pod along line A1-A2 of FIG. 4, according to an embodiment.

FIG. 6 is a cross-sectional view of inner pod 400 along line A1-A2 of FIG. 4, according to an embodiment.

In an embodiment, when the inner pod 400 is assembled, the stand-off mechanism (430, 440, 450) can separate the cover 410 and the baseplate 420. In an embodiment, the size or the height of the gap (e.g., a linear gap) between the cover 410 and the baseplate 420 (when the cover 410 is attached to the baseplate 420) can be controlled during assembling of the stand-off mechanism (430, 440, 450) such as during insertion of the pads 440 into the recesses 450. In such embodiment, the pads 440 act as stand-offs inserting into the recesses 450 and separating the cover 410 and the baseplate 420. The surfaces of the recesses 450 (that are at a different plane from the plane of the sealing surfaces) that contact with the pads 440 can create wear surfaces that are out of the actual flow of the air or gas going through the gap (e.g., a linear gap, see 470 of FIG. 7) between the cover 410 and the baseplate 420.

Figure 7:
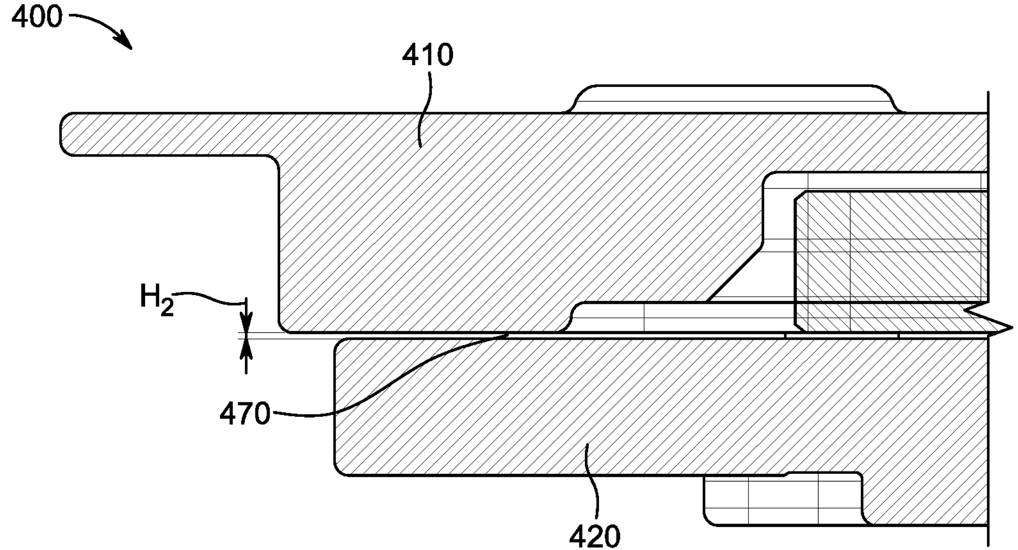
FIG. 7 is a schematic view of a gap created between a cover and a baseplate, according to an embodiment.

FIG. 7 is a schematic view 700 of a gap 470 created between a cover 410 and a baseplate 420, according to an embodiment.

The gap 470 can be a linear gap having a size or height of H2. In an embodiment, a minimum size of the linear gap 470 is at or about 2 microns. It will be appreciated that the minimum size can help preventing/reducing wear in the sealing surfaces of the cover 410 and the baseplate 420. In an embodiment, a maximum size of the linear gap 470 is at or about 40 microns. In an embodiment, a maximum size of the linear gap 470 is at or about 30 microns. It will be appreciated that with a size up to the maximum size, sealing can be created via the linear gap 470 to achieve a desired sealing between the cover 410 and the baseplate 420 when the cover 410 is attached to the baseplate (without the cover 410 being contacted with the baseplate 420) since there can be little air and/or particles going through the small size linear gap 470. Testing of conductance (i.e., the amount of air that transfers to the inside of the inner pod via the sealing surfaces versus through filters on the pods) on the pods shows that desired sealing results can be achieved with gaps up to at or about 40 microns due to the flatness on the sealing surfaces.

In an embodiment, the linear gap 470 can extend from the periphery 412A of the cover 410 and the periphery 422A of baseplate 420 to the boundary (412B, 422B) of an interior space within the inner pod 400. That is, the linear gap 470 extends along an entire periphery (or sealing surfaces) of the cover 410 and the baseplate 420, setting the cover 410 apart from the baseplate 420, when the cover 410 is attached to the baseplate 420. In an embodiment, when the stand-off mechanism (430, 440, 450) is used to create the linear gap 470, a minimum distance between each pad 440 and an inner boundary (412B, 422B) of the sealing surface of the cover 410 and/or the sealing surface of the baseplate 420 is at or about 4 mm.

It will be appreciated that if the gap is a non-linear gap, pumping effect may be created. It will also be appreciated that if a tortuous path (with e.g., pockets, protrusions, valleys, or the like along the path) exists between the periphery 412A of the cover 410 (and/or the periphery 422A of baseplate 420) and the boundary (412B, 422B) of an interior space within the inner pod 400, pumping effect may be created. As defined herein, the term “pumping effect” can refer to e.g., a movement that compresses air pockets, which leads to air movement. For a non-linear gap or a tortuous path, a rush of air differential pressure may be created to drive/push/pull particles into the interior space of the inner pod 400, when separating the cover 410 from the baseplate 420. In contrast, a linear gap may prevent such undesirable situation from happening since the linear gap can open immediately and can avoid or reduce the pumping effect.

Figure 8:
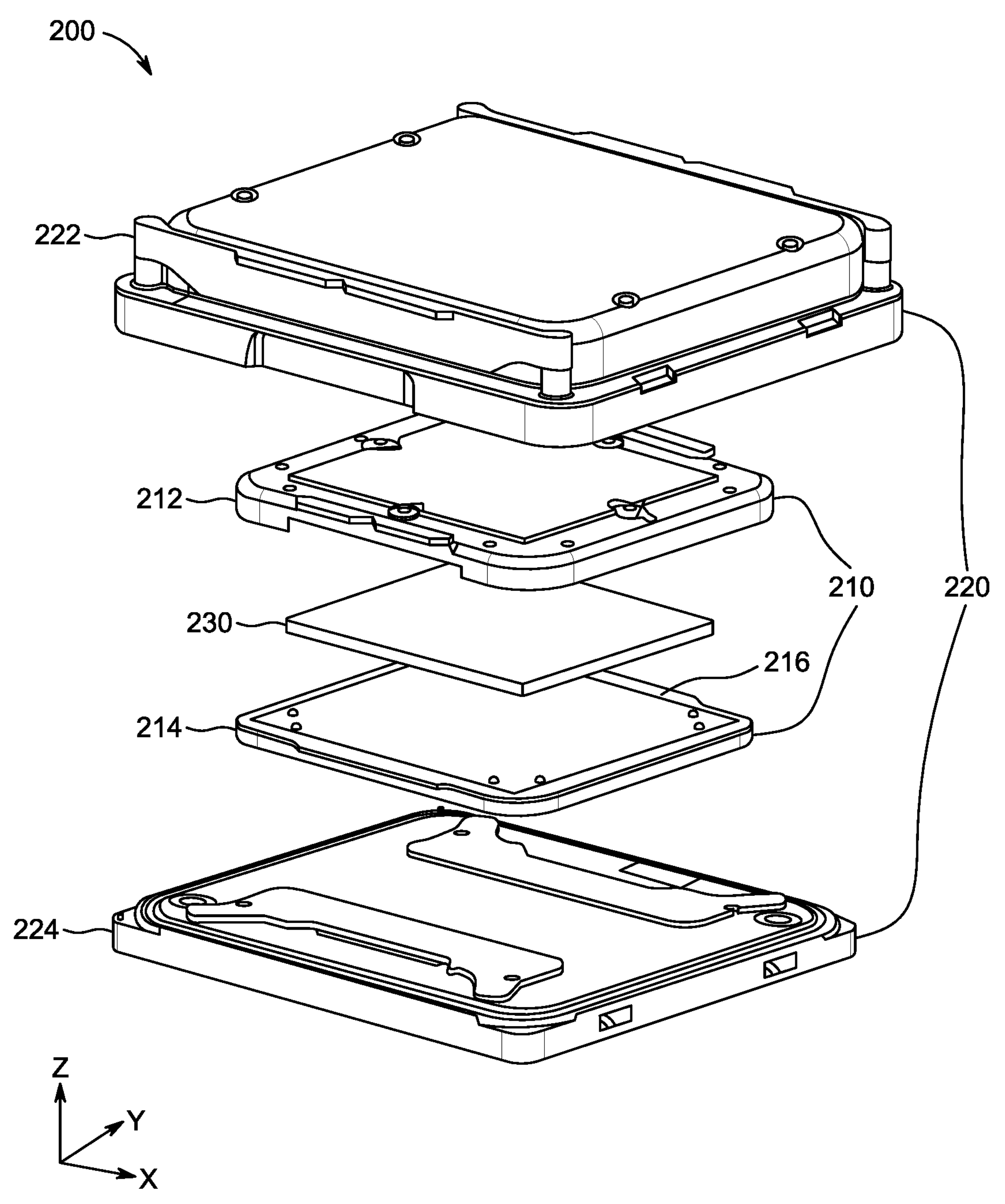
FIG. 8 is a prospective view of a reticle pod, according to an embodiment.

FIG. 8 is a prospective view of a reticle pod 200, according to an embodiment. The reticle pod 200 includes an inner pod 210 and an outer pod 220. For example, the reticle pod 200 can be, but is not limited to, a reticle pod for EUV processing of photolithography masks, or the like. In an embodiment, the inner pod 210 can have e.g., a length of at or about 8 inches and a width of at or about 8 inches.

The inner pod 210 includes a cover 212 and a baseplate 214. In an embodiment, the cover 212 and the baseplate 214 are configured to be joined together to provide sealing between the baseplate 214 and the cover 212. When joined together, the cover 212 and the baseplate 214 define an internal space sized and shaped contain a reticle 230 for use. For example, the reticle 230 can be, but is not limited to, a photolithography mask that will be used in EUV processing, etc. In some embodiments, at least one of the cover 212 and the baseplate 214 include one or more stand-off mechanism 216 as similarly discussed above for the baseplate 10 and cover 40 in FIGS. 1A-7. In some embodiments, the cover 212 and the baseplate 214 each include at least one of the stand-off mechanism 216 (obscured in FIG. 8 for the cover 212). The cover 212 can be, for example, the cover 40 described above and shown in FIGS. 1A, 1B, and 3. The baseplate 214 can be, for example, the baseplate 10 described above and shown in FIGS. 1A, 1B, and 2.

The outer pod 220 includes an outer pod dome 222 and an outer pod door 224. The outer pod 220 is configured to accommodate the inner pod 210 within an internal space defined by the outer pod dome 222 and the outer pod door 224. The outer pod dome 222 can be secured to the outer pod door 224 to enclose the internal space and contain the inner pod 210, for example during transport and handling of the reticle pod 200. The outer pod dome 222 and the outer pod door 224 can each include or be made entirely of one or more polymer materials or any other suitable materials.

Figure 9:
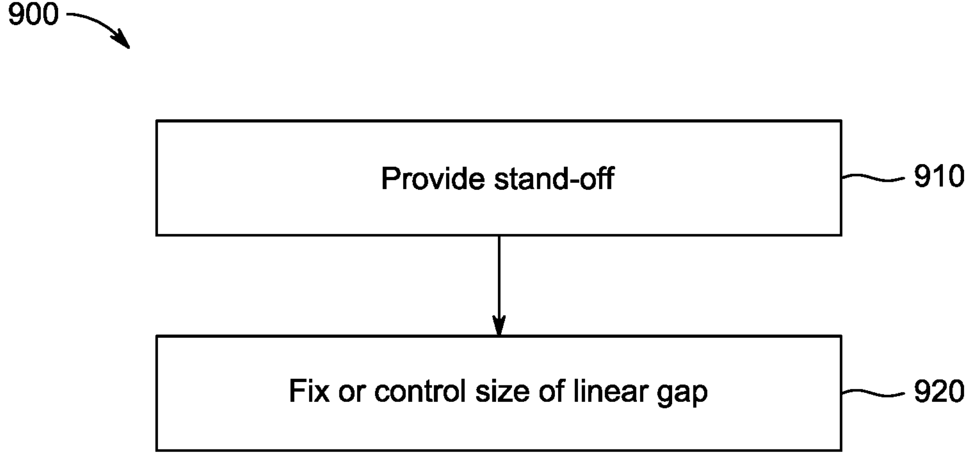
FIG. 9 is a flow chart for a method of assembling a reticle pod, according to an embodiment.

FIG. 9 is a flow chart for a method 900 of assembling an inner pod of a reticle pod, according to an embodiment. Although illustrated as discrete blocks, various blocks may be divided into additional blocks, combined into fewer blocks, or eliminated, depending on the desired implementation. The inner pod can be the inner pod (1, 210, 400) described in FIGS. 1A-8.

In an embodiment, the method 900 can begin at 910. Block 910 can refer to providing a plurality of stand-offs, the stand-offs creating a linear gap such as linear gap 470. In an embodiment, creating a linear gap 470 can include assembling the stand-off mechanism (430, 440, 450). In another embodiment, creating a linear gap 470 can include utilizing any other suitable mechanism to create the linear gap 470. In an embodiment, assembling the stand-off mechanism (430, 440, 450) can include inserting the pads 440 into the retention openings 430, respectively. Block 910 may be followed by Block 920.

Block 920 can refer to fixing or controlling the size of the linear gap 470. In an embodiment, fixing the size of the linear gap 470 can include adjusting a height of each pad 440 to a fixed height. Adjusting the height of each pad 440 to the fixed height can include machining the pads 440 such that the height of each pad 440 is the fixed height, and/or pressing the pads 440 into the recesses 450 such that the height of each pad 440 is the fixed height. For example, the pads 440 can be pressed to a fixed depth to create or control the size of the linear gap 470.

Embodiments disclosed herein can minimize the wear of the interface or the barrier due to the cover and the baseplate coming together, to prevent particles from being generated from the wear at the sealing surfaces and being pulled/pushed/driven into the internal space of the inner pod, without compromising the seal requirement, by creating a controlled linear gap using suitable mechanisms.

Aspects:

It is understood that any of aspects 1-18 can be combined with any of aspects 19-23.

Aspect 1. An apparatus comprising a reticle pod, the reticle pod having:

- a baseplate having a first surface, the first surface including a first sealing surface on a periphery of the baseplate;
- a cover having a second surface, the second surface including a second sealing surface on a periphery of the cover; and
- a stand-off mechanism on at least one of the cover and the baseplate,
- wherein the stand-off mechanism is configured to create sealing via a linear gap between the first sealing surface and the second sealing surface when the cover is attached to the baseplate.

Aspect 2. The apparatus according to aspect 1, wherein the linear gap extends from the periphery of the cover and the periphery of baseplate to an interior space within the reticle pod.

Aspect 3. The apparatus according to any of aspects 1-2, wherein the reticle pod is an Extreme Ultraviolet (EUV) reticle pod, the baseplate and the cover are configured to accommodate a reticle when the cover is attached to the baseplate.

Aspect 4. The apparatus according to any of aspects 1-3, further comprising an outer pod dome and an outer pod door, the outer pod dome and the outer pod door configured to accommodate the baseplate and the cover within the outer pod dome when the outer pod door is attached to the outer pod dome.

Aspect 5. The apparatus according to any of aspects 1-4, wherein a minimum size of the linear gap is at or about 2 microns.

Aspect 6. The apparatus according to any of aspects 1-5, wherein a maximum size of the linear gap is at or about 40 microns.

Aspect 7. The apparatus according to any of aspects 1-6, wherein the stand-off mechanism includes a plurality of projections from one of the cover or the baseplate, the other of the cover or the baseplate including a surface configured to contact the plurality of projections.

Aspect 8. The apparatus according to any of aspects 1-7, wherein the stand-off mechanism includes a plurality of stand-off pads,

- one of the first sealing surface and the second sealing surface includes a plurality of retention openings,
- the other of the first sealing surface and the second sealing surface includes a plurality of recesses,
- each pad of the plurality of pads extends into one retention opening of the plurality of retention openings and is partially received in one recess of the plurality of recesses, respectively.

Aspect 9. The apparatus according to aspect 8, wherein the plurality of pads includes at least three pads.

Aspect 10. The apparatus according to aspect 8, wherein the plurality of pads includes eight pads.

Aspect 11. The apparatus according to any of aspects 8-9, wherein the plurality of pads is made of polymer.

Aspect 12. The apparatus according to any of aspects 8-9, wherein the plurality of pads is made of metal.

Aspect 13. The apparatus according to any of aspects 8-12, wherein the plurality of retention openings is a plurality of through holes.

Aspect 14. The apparatus according to any of aspects 8-13, wherein the plurality of pads is pressed in the plurality of retention openings, respectively, and extends a fixed height from the one of the first sealing surface and the second sealing surface to create the linear gap.

Aspect 15. The apparatus according to any of aspects 8-14, wherein the plurality of pads is molded or machined in the plurality of retention openings, respectively, and extends a fixed height from the one of the first sealing surface and the second sealing surface to create the linear gap.

Aspect 16. The apparatus according to any of aspects 8-15, wherein a top surface of each pad of the plurality of pads is flush with or is slightly below flush with a top surface of the cover or a bottom surface of the baseplate.

Aspect 17. The apparatus according to any of aspects 1-16, wherein the reticle pod further includes a filter, and the sealing is configured such that the reticle pod has a conductance of at least 90%.

Aspect 18. The apparatus according to any of aspects 1-17, wherein the conductance is at least 94%.

Aspect 19. A method of assembling a reticle pod, the reticle pod including a baseplate having a first surface, a cover having a second surface, and a stand-off mechanism on at least one of the cover and the baseplate, wherein the first surface includes a first sealing surface on a periphery of the baseplate, the second surface includes a second sealing surface on a periphery of the cover, the stand-off mechanism is configured to create sealing via a linear gap between the first sealing surface and the second sealing surface when the cover is attached to the baseplate, the method comprising providing the stand-off mechanism on the at least one of the cover and the baseplate.

Aspect 20. The method of claim 19, further comprising:
- inserting a plurality of stand-off pads of the stand-off mechanism into a plurality of retention openings, respectively; and
- adjusting a height of each pad of the plurality of pads to a fixed height, wherein the plurality of retention openings is on one of the first sealing surface and the second sealing surface, and
- a plurality of recesses is on the other of the first sealing surface and the second sealing surface.

Aspect 21. The method according to aspect 20, wherein adjusting the height of each pad of the plurality of pads to the fixed height includes machining the plurality of pads such that the height of each pad of the plurality of pads is the fixed height.

Aspect 22. The method according to aspect 20, wherein adjusting the height of each pad of the plurality of pads to the fixed height includes pressing the plurality of pads such that the height of each pad of the plurality of pads is the fixed height.

Aspect 23. The method of claim 20, wherein a minimum distance between each pad of the plurality of pads and an inner boundary of the first sealing surface or the second sealing surface is at or about 4 mm.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The terminology used in this specification is intended to describe particular embodiments and is not intended to be limiting. The terms “a,” “an,” and “the” include the plural forms as well, unless clearly indicated otherwise. The terms “comprises” and/or “comprising,” when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes can be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. An apparatus comprising a reticle pod, the reticle pod having:
- a baseplate having a first surface, the first surface including a first sealing surface on a periphery of the baseplate;
- a cover having a second surface, the second surface including a second sealing surface on a periphery of the cover; and
- a stand-off mechanism on at least one of the cover and the baseplate,
- wherein the stand-off mechanism is configured to prevent contact between the first sealing surface and the second sealing surface and to create sealing via a linear gap between the first sealing surface and the second sealing surface when the cover is attached to the baseplate.

2. The apparatus of claim 1, wherein the linear gap extends from the periphery of the cover and the periphery of the baseplate to an interior space within the reticle pod.

3. The apparatus of claim 1, wherein the reticle pod is an Extreme Ultraviolet (EUV) reticle pod,
- the baseplate and the cover are configured to accommodate a reticle when the cover is attached to the baseplate.

4. The apparatus of claim 1, wherein a minimum size of the linear gap is at or about 2 microns.

5. The apparatus of claim 1, wherein a maximum size of the linear gap is at or about 40 microns.

6. The apparatus of claim 1, wherein the stand-off mechanism includes a plurality of projections from one of the cover or the baseplate, the other of the cover or the baseplate including a surface configured to contact the plurality of projections.

7. The apparatus of claim 1, wherein the stand-off mechanism includes a plurality of stand-off pads,
- one of the first sealing surface and the second sealing surface includes a plurality of retention openings,
- the other of the first sealing surface and the second sealing surface includes a plurality of recesses,
- each pad of the plurality of pads extends into one retention opening of the plurality of retention openings and is partially received in one recess of the plurality of recesses, respectively.

8. The apparatus of claim 7, wherein the plurality of pads includes at least three pads.

9. The apparatus of claim 7, wherein the plurality of pads is made of polymer.

10. The apparatus of claim 7, wherein the plurality of pads is made of metal.

11. The apparatus of claim 7, wherein the plurality of retention openings is a plurality of through holes.

12. The apparatus of claim 7, wherein the plurality of pads is pressed in the plurality of retention openings, respectively, and extends a fixed height from the one of the first sealing surface and the second sealing surface to create the linear gap.

13. The apparatus of claim 7, wherein the plurality of pads is molded or machined in the plurality of retention openings, respectively, and extends a fixed height from the one of the first sealing surface and the second sealing surface to create the linear gap.

14. The apparatus of claim 7, wherein a top surface of each pad of the plurality of pads is flush with or is slightly below flush with a top surface of the cover or a bottom surface of the baseplate.

15. The apparatus of claim 1, wherein the reticle pod further includes a filter, and the sealing is configured such that the reticle pod has a conductance of at least 90%.

16. A method of assembling a reticle pod, the reticle pod including a baseplate having a first surface, a cover having a second surface, and a stand-off mechanism on at least one of the cover and the baseplate, wherein the first surface includes a first sealing surface on a periphery of the baseplate, the second surface includes a second sealing surface on a periphery of the cover, the stand-off mechanism is configured to prevent contact between the first sealing surface and the second sealing surface and to create sealing via a linear gap between the first sealing surface and the second sealing surface when the cover is attached to the baseplate, the method comprising providing the stand-off mechanism on the at least one of the cover and the baseplate.

17. The method of claim 16, further comprising:

inserting a plurality of stand-off pads of the stand-off mechanism into a plurality of retention openings, respectively; and adjusting a height of each pad of the plurality of pads to a fixed height, wherein the plurality of retention openings is on one of the first sealing surface and the second sealing surface, and a plurality of recesses is on the other of the first sealing surface and the second sealing surface.

18. The method of claim 17, wherein adjusting the height of each pad of the plurality of pads to the fixed height includes machining the plurality of pads such that the height of each pad of the plurality of pads is the fixed height.

19. The method of claim 17, wherein adjusting the height of each pad of the plurality of pads to the fixed height includes pressing the plurality of pads such that the height of each pad of the plurality of pads is the fixed height.

20. The method of claim 16, wherein a minimum distance between each pad of the plurality of pads and an inner boundary of the first sealing surface or the second sealing surface is at or about 4 mm.

* * * * *